United States Patent
Park et al.

(10) Patent No.: US 11,687,002 B2
(45) Date of Patent: Jun. 27, 2023

(54) BINDER RESIN, POSITIVE-TYPE PHOTOSENSITIVE RESIN COMPOSITION, INSULATING FILM AND SEMICONDUCTOR DEVICE

(71) Applicant: LG CHEM, LTD., Seoul (KR)

(72) Inventors: Sumin Park, Daejeon (KR); Minyoung Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 158 days.

(21) Appl. No.: 17/390,280

(22) Filed: Jul. 30, 2021

(65) Prior Publication Data

US 2022/0043349 A1 Feb. 10, 2022

(30) Foreign Application Priority Data

Jul. 30, 2020 (KR) .................. 10-2020-0095253

(51) Int. Cl.
*G03F 7/039* (2006.01)
*C08L 79/08* (2006.01)

(52) U.S. Cl.
CPC ............ *G03F 7/0392* (2013.01); *C08L 79/08* (2013.01); *C08L 2203/20* (2013.01)

(58) Field of Classification Search
CPC .......... G03F 7/0392; G03F 7/039; G03F 7/40; G03F 7/0233; G03F 7/0226; C08G 69/26; C08G 71/04; C08G 73/1071; C08G 73/1042; C08G 18/3831; C09D 175/04; C08L 2203/20; C08L 79/08
See application file for complete search history.

(56) References Cited

U.S. PATENT DOCUMENTS 7,435,525 B2 * 10/2008 Hattori .................. G03F 7/0233
430/326

FOREIGN PATENT DOCUMENTS

| KR | 2007-0031023 | A |   | 3/2007 |   |
|----|--------------|---|---|--------|---|
| KR | 2015-0095561 | A |   | 8/2015 |   |
| KR | 20150095561  | A | * | 8/2015 | ............ C08G 73/10 |
| WO | 2009-136557  | A1 |   | 9/2011 |   |
| WO | 2015-012316  | A1 |   | 3/2017 |   |
| WO | 2017-038828  | A1 |   | 6/2018 |   |
| WO | 2018-155674  | A1 |   | 12/2019 |   |

OTHER PUBLICATIONS

Translated Description of Kashishita (Year: 2015).*

* cited by examiner

*Primary Examiner* — Pamela H Weiss
*Assistant Examiner* — Andrew Preston Traywick
(74) *Attorney, Agent, or Firm* — Rothwell, Figg, Ernst & Manbeck, P.C.

(57) ABSTRACT

The present specification relates to a binder resin, a photosensitive resin composition, an insulating film and a semiconductor device.

10 Claims, No Drawings

BINDER RESIN, POSITIVE-TYPE PHOTOSENSITIVE RESIN COMPOSITION, INSULATING FILM AND SEMICONDUCTOR DEVICE

TECHNICAL FIELD

This application claims priority to and the benefit of Korean Patent Application No. 10-2020-0095253 filed in the Korean Intellectual Property Office on Jul. 30, 2020, the entire contents of which are incorporated herein by reference.

The present application relates to a binder resin, a positive-type photosensitive resin composition, an insulating film and a semiconductor device.

BACKGROUND ART

Since an interlayer insulating film or a surface protective film of a semiconductor device is required to have excellent mechanical properties and high heat resistance, a polyimide-based binder resin having excellent physical properties is used. The polyimide-based binder resin requires a high temperature heat treatment of 350° C. or higher in order to obtain a pattern and a thin film which have excellent physical properties using a polyimide precursor.

Since a heat treatment of 220° C. or lower has been recently required to reduce a heat load on a substrate, a ring-closed polyimide-based binder resin has been used, and studies to improve the physical properties of patterns and thin films have been continuously conducted.

DISCLOSURE

Technical Problem

The present specification has been made in an effort to provide a binder resin, a positive-type photosensitive resin composition, an insulating film and a semiconductor device.

Technical Solution

An exemplary embodiment of the present specification provides a binder resin including a structure in which a compound of the following Chemical Formula 1 and a dianhydride compound are polymerized.

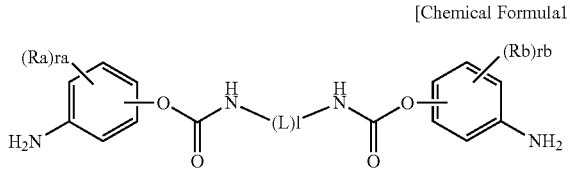

[Chemical Formula 1]

In Chemical Formula 1,
L is —O—; a substituted or unsubstituted alkylene group; or a substituted or unsubstituted arylene group,
l is an integer from 1 to 10,
when l is 2 or higher, L's are the same as or different from each other,
Ra and Rb are the same as or different from each other, and are each independently hydrogen; or a substituted or unsubstituted alkyl group,
ra and rb are the same as or different from each other, and are each independently an integer from 0 to 4, and when ra is 2 or higher, Ra's are the same as or different from each other, and when rb is 2 or higher, Rb's are the same as or different from each other,
wherein the dianhydride compound is an oxydiphthalic anhydride (ODPA).

An exemplary embodiment of the present specification provides a positive-type photosensitive resin composition including: the binder resin; a photo active compound; a cross-linking agent; a surfactant; and a solvent.

An exemplary embodiment of the present specification provides an insulating film including the positive-type photosensitive resin composition or a cured product thereof.

An exemplary embodiment of the present specification provides a semiconductor device including the insulating film.

Advantageous Effects

A binder resin according to the present specification and a positive-type photosensitive resin composition including the binder resin are excellent in chemical resistance and mechanical properties.

MODE FOR INVENTION

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

An exemplary embodiment of the present specification provides a binder resin including a structure in which a compound of the following Chemical Formula 1 and a dianhydride compound are polymerized.

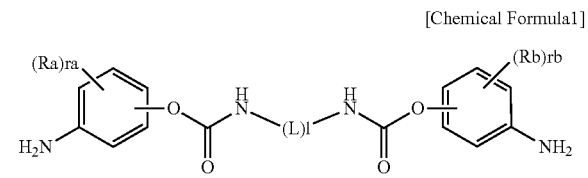

[Chemical Formula 1]

In Chemical Formula 1,
L is —O—; a substituted or unsubstituted alkylene group; or a substituted or unsubstituted arylene group,
l is an integer from 1 to 10,
when l is 2 or higher, L's are the same as or different from each other,
Ra and Rb are the same as or different from each other, and are each independently hydrogen; or a substituted or unsubstituted alkyl group,
ra and rb are the same as or different from each other, and are each independently an integer from 0 to 4, and when ra is 2 or higher, Ra's are the same as or different from each other, and when rb is 2 or higher, Rb's are the same as or different from each other, and
wherein the dianhydride compound is an oxydiphthalic anhydride (ODPA).

Since the binder resin including a structure in which the compound of Chemical Formula 1 and a dianhydride compound are polymerized includes a urethane functional group, it is possible to prepare an insulating film including a positive-type photosensitive resin composition which is excellent in chemical resistance and mechanical properties due to a 3D structure thereof, and a cured product thereof.

In the present specification, *—— means a moiety bonded to another substituent or a bonding portion.

In the present specification, examples of substituents will be described below, but are not limited thereto.

In the present specification, the term "substituted or unsubstituted" means being substituted with one or more substituents selected from the group consisting of deuterium; a halogen group; a nitrile group; a nitro group; —OH; —COOH; an alkyl group; a cycloalkyl group; an alkenyl group; a cycloalkenyl group; alkyl ether; and an aryl group or having no substituent.

In the present specification, the alkyl group may be straight-chained or branched, and the number of carbon atoms thereof is not particularly limited, but the number of carbon atoms of the alkyl group may be 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, an n-propyl group, an isopropyl group, an n-butyl group, an isobutyl group, a tert-butyl group, an n-pentyl group, an n-hexyl group, an n-heptyl group, an n-octyl group, and the like, but are not limited thereto.

In the present specification, a cycloalkyl group is not particularly limited, but according to an exemplary embodiment, the number of carbon atoms of the cycloalkyl group is 3 to 30. According to yet another exemplary embodiment, the number of carbon atoms of the cycloalkyl group is 3 to 20. According to yet another exemplary embodiment, the number of carbon atoms of the cycloalkyl group is 3 to 10. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an alkenyl group may be straight-chained or branched, the number of carbon atoms thereof is not particularly limited, but according to an exemplary embodiment, the number of carbon atoms of the alkenyl group is 2 to 30. According to yet another exemplary embodiment, the number of carbon atoms of the alkenyl group is 2 to 20. According to yet another exemplary embodiment, the number of carbon atoms of the alkenyl group is 2 to 10. Specific examples of the alkenyl group are preferably an alkenyl group in which an aryl group, such as a stylbenyl group and a styrenyl group, is substituted, but are not limited thereto.

In the present specification, a cycloalkenyl group is not particularly limited, but according to an exemplary embodiment, the number of carbon atoms of the cycloalkenyl group is 3 to 30. According to yet another exemplary embodiment, the number of carbon atoms of the cycloalkenyl group is 3 to 20. According to yet another exemplary embodiment, the number of carbon atoms of the cycloalkenyl group is 3 to 10. Examples of the cycloalkenyl group are preferably a cyclopentenylene group and a cyclohexenylene group, but are not limited thereto.

In the present specification, an alkyl ether group is not particularly limited, but according to an exemplary embodiment, the number of carbon atoms of the alkyl ether group is 3 to 30. According to yet another exemplary embodiment, the number of carbon atoms of the alkyl ether group is 3 to 20. According to yet another exemplary embodiment, the number of carbon atoms of the alkyl ether group is 3 to 10. Examples of the alkyl ether group are preferably a butyl ether group, a pentyl ether group, and a hexyl ether group, but are not limited thereto. The alkyl ether group may be represented by —ORx, and Rx is a substituted or unsubstituted alkyl group.

In the present specification, the description on the alkyl group may be applied to the alkylene group, except that the alkane has two bonding positions. The alkylene group may be straight-chained, branched, or cyclic. The number of carbon atoms of the alkylene group is not particularly limited, but may be, for example, 1 to 30. In addition, the number of carbon atoms thereof may be 1 to 20, and may be 1 to 10.

In the present specification, the description on the cycloalkyl group may be applied to the cycloalkylene group, except that the cycloalkyl group has two bonding positions.

In the present specification, an aryl group is not particularly limited, but may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of a monocyclic aryl group as the aryl group include a phenyl group, a biphenyl group, a terphenyl group, and the like, but are not limited thereto. Examples of the polycyclic aryl group include a naphthyl group, an anthracenyl group, an indenyl group, a phenanthrenyl group, a pyrenyl group, a perylenyl group, a triphenyl group, a chrysenyl group, a fluorenyl group, and the like, but are not limited thereto.

In the present specification, a fluorenyl group may be substituted, and two substituents may be bonded to each other to form a spiro structure.

When the fluorenyl group is substituted, the substituent may be a spirofluorenyl group such as

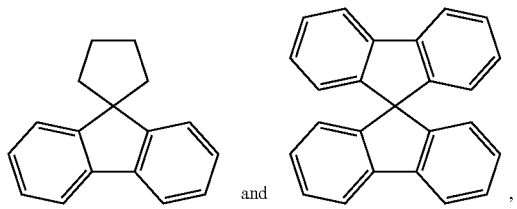

and and a substituted fluorenyl group such as

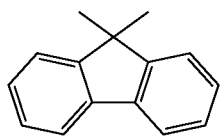

(a 9,9-dimethylfluorenyl group) and

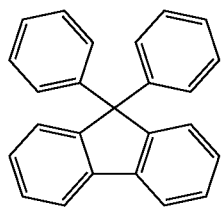 [SMILES: c1ccc(C2(c3ccccc3)c3ccccc3-c3ccccc32)cc1]

(a 9,9-diphenylfluorenyl group). However, the substituent is not limited thereto.

In the present specification, the description on the aryl group may be applied to the arylene group, except that the aryl group has two bonding positions.

In the present specification, a heterocyclic group is a heterocyclic group including O, N, or S as a heteroatom, and the number of carbon atoms thereof is not particularly limited, but is 2 to 30, specifically 2 to 20. Examples of a heteroaryl group include a thiophene group, a furan group, a pyrrole group, an imidazole group, a thiazole group, an oxazole group, an oxadiazole group, a triazole group, a pyridyl group, a bipyridyl group, a triazine group, an acridyl group, a pyridazine group, a qinolinyl group, an isoquinoline group, an indole group, a carbazole group, a benzoxazole group, a benzoimidazole group, a benzothiazole group, a benzocarbazole group, a benzothiophene group, a dibenzothiophene group, a benzofuranyl group, a dibenzofuranyl group, and the like, but are not limited thereto. The above-described description on the heterocyclic group may be applied to a heteroaryl group except for an aromatic heteroaryl group.

In the present specification, the description on the cycloalkenyl group may be applied to the cycloalkenylene group, except that the cycloalkenyl group has two bonding positions.

In the present specification, an aromatic ring may be an aryl group or a heteroaryl group, and the above-described description may be applied to the aryl group or the heteroaryl group. The aliphatic ring may mean a ring other than the aromatic ring.

In an exemplary embodiment of the present specification, L is a substituted or unsubstituted alkylene group.

In an exemplary embodiment of the present specification, L is —O—; a substituted or unsubstituted alkylene group having 1 to 30 carbon atoms; or a substituted or unsubstituted arylene group having 6 to 30 carbon atoms.

In an exemplary embodiment of the present specification, L is —O—; a substituted or unsubstituted alkylene group having 1 to 20 carbon atoms; or a substituted or unsubstituted arylene group having 6 to 20 carbon atoms.

In an exemplary embodiment of the present specification, L is —O—; a substituted or unsubstituted alkylene group having 1 to 10 carbon atoms; or a substituted or unsubstituted arylene group having 6 to 12 carbon atoms.

In an exemplary embodiment of the present specification, L is —O—; a substituted or unsubstituted hexylene group; or a substituted or unsubstituted phenylene group.

In an exemplary embodiment of the present specification, L is —O—; a hexylene group; or a phenylene group.

In an exemplary embodiment of the present specification, Ra and Rb are the same as or different from each other, and are each independently hydrogen; or a substituted or unsubstituted alkyl group having 1 to 30 carbon atoms.

In an exemplary embodiment of the present specification, Ra and Rb are the same as or different from each other, and are each independently hydrogen; or a substituted or unsubstituted alkyl group having 1 to 20 carbon atoms.

In an exemplary embodiment of the present specification, Ra and Rb are the same as or different from each other, and are each independently hydrogen; or a substituted or unsubstituted alkyl group having 1 to 10 carbon atoms.

In an exemplary embodiment of the present specification, Ra and Rb are hydrogen.

In an exemplary embodiment of the present specification, Ml is represented by the following Chemical Formula 2.

[Chemical Formula 2]

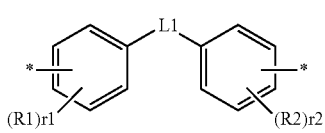

In Chemical Formula 2,

*⎯ means a moiety linked to Chemical Formula 1,

L1 is —O—; a substituted or unsubstituted alkylene group; or a substituted or unsubstituted arylene group, R1 and R2 are the same as or different from each other, and are each independently hydrogen; or a substituted or unsubstituted alkyl group, and r1 and r2 are the same as or different from each other, and are each independently an integer from 0 to 4, and when r1 and r2 are each 2 or higher, R1 and R2 are each the same as or different from each other.

In an exemplary embodiment of the present specification, L1 is —O—; a substituted or unsubstituted alkylene group having 1 to 30 carbon atoms; or a substituted or unsubstituted arylene group having 6 to 30 carbon atoms.

In an exemplary embodiment of the present specification, L1 is —O—; a substituted or unsubstituted alkylene group having 1 to 20 carbon atoms; or a substituted or unsubstituted arylene group having 6 to 20 carbon atoms.

In an exemplary embodiment of the present specification, L1 is —O—; a substituted or unsubstituted alkylene group having 1 to 10 carbon atoms; or a substituted or unsubstituted arylene group having 6 to 12 carbon atoms.

In an exemplary embodiment of the present specification, L1 is —O—.

In an exemplary embodiment of the present specification, R1 and R2 are the same as or different from each other, and are each independently hydrogen; or a substituted or unsubstituted alkyl group having 1 to 30 carbon atoms.

In an exemplary embodiment of the present specification, R1 and R2 are the same as or different from each other, and are each independently hydrogen; or a substituted or unsubstituted alkyl group having 1 to 20 carbon atoms.

In an exemplary embodiment of the present specification, R1 and R2 are the same as or different from each other, and are each independently hydrogen; or a substituted or unsubstituted alkyl group having 1 to 10 carbon atoms.

In an exemplary embodiment of the present specification, R1 and R2 are hydrogen.

In an exemplary embodiment of the present specification, the compound of Chemical Formula 1 may be specifically any one of the following compounds.

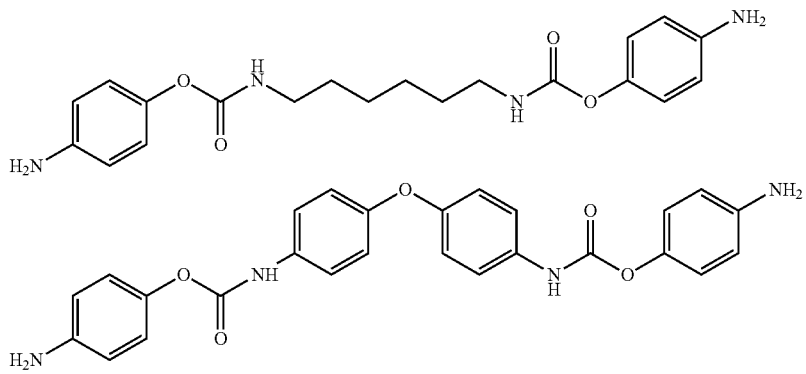

In an exemplary embodiment of the present specification, the dianhydride compound may be an oxydiphthalic anhydride (ODPA), a pyromellitic dianhydride (PMDA), 4,4'-(hexafluoroisopropylidene)diphthalic anhydride (6FDA), 3,3',4,4'-biphenyltetracarboxylic dianhydride (BPDA), 3,3',4,4'-diphenylsulfonetetracarboxylic dianhydride (DSDA), 3,3',4,4'-benzophenonetetracarboxylic dianhydride (BTDA), 5-(2,5-dioxotetrahydrofuryl)-3-methyl-3-cyclohexene-1,2-dicarboxylic anhydride (DOCDA) or 1,2,4,5-cyclohexanetetracarboxylic dianhydride (HPMDA), but is not limited thereto, and may be employed without limitation as long as the dianhydride compound is applied to the art. Preferably, the dianhydride compound is an oxydiphthalic anhydride (ODPA).

The oxydiphthalic anhydride is specifically 4,4-oxydiphthalic anhydride.

In an exemplary embodiment of the present specification, the polymerized structure of the compound represented by Chemical Formula 1; and the dianhydride compound may be represented by the following Chemical Formula 1-1.

[Chemical Formula 1-1]

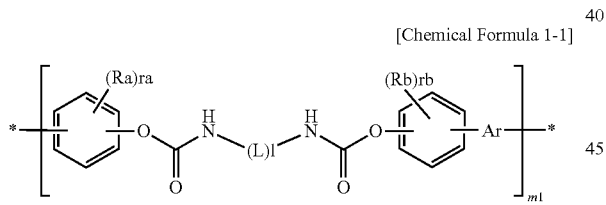

In Chemical Formula 1-1, *⎯ means a moiety linked to another substituent or a repeating unit, L, l, Ra, Rb, ra and rb are the same as the definitions in Chemical Formula 1, m1 is an integer from 1 to 130, and when m1 is 2 or higher, structures in the parenthesis are the same as or different from each other, Ar is any one of the following structures, and

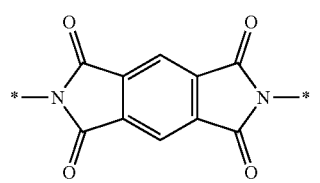

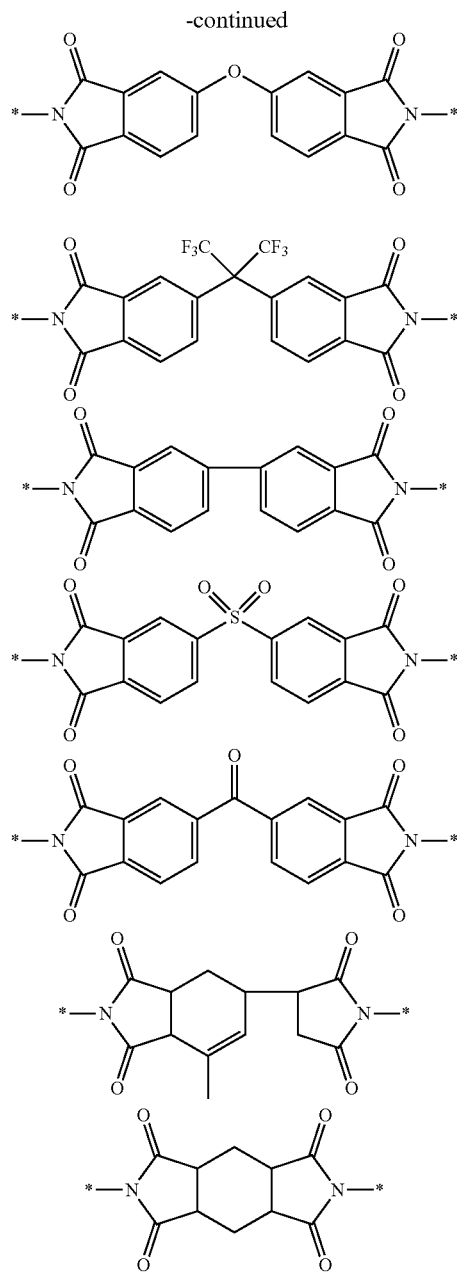

in the structure, *—— means a moiety linked to Chemical Formula 1-1.

In an exemplary embodiment of the present specification, Chemical Formula 1-1 may be any one of the following structures, but is not limited thereto.

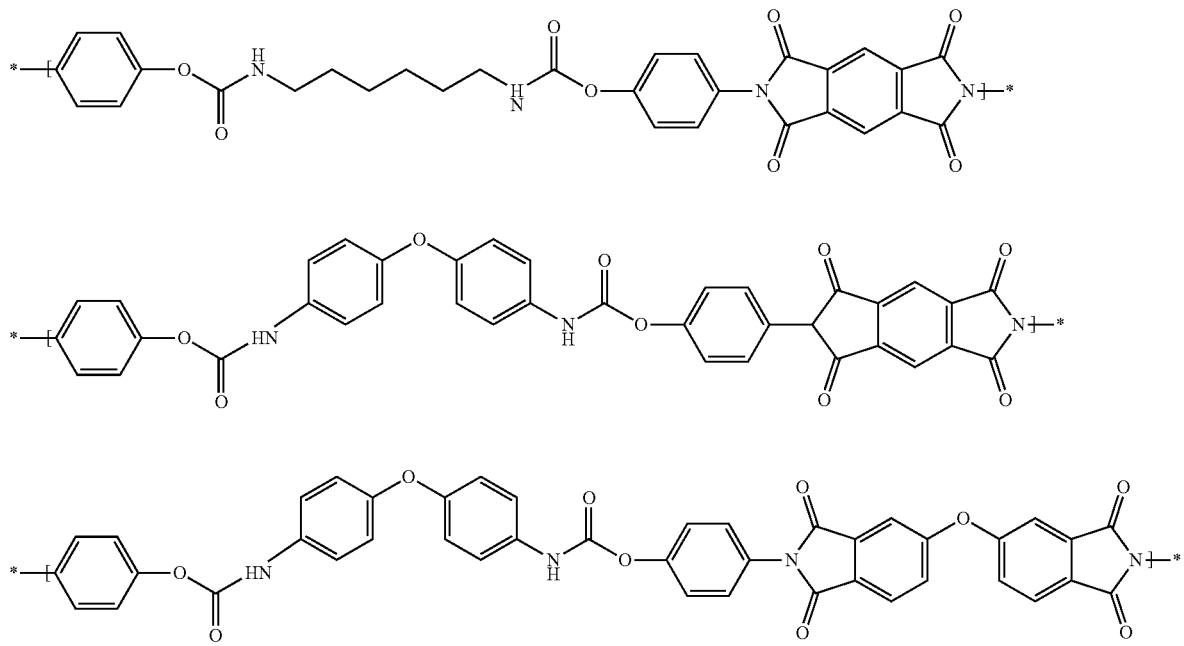

In the structure, *—— means a moiety linked to another substituent or a repeating unit.

In an exemplary embodiment of the present specification, Chemical Formula 1-1 is represented by the following structure.

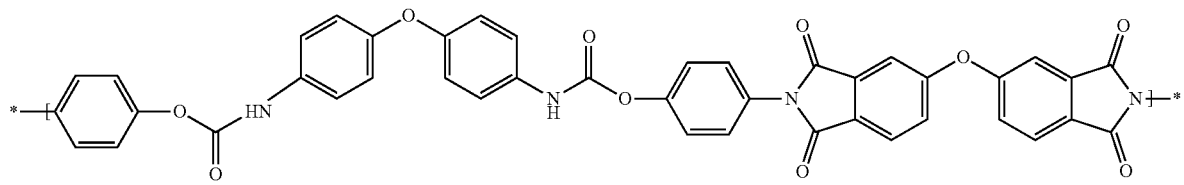

In the structure, *—— means a moiety linked to another substituent or a repeating unit.

In an exemplary embodiment of the present specification, the compound of Chemical Formula 1 may be included in an amount of 10 parts by weight to 90 parts by weight based on 100 parts by weight of the dianhydride compound, and polymerized.

When the compound of Chemical Formula 1 satisfies the above-described range of parts by weight, it is possible to provide a binder resin capable of preparing a positive-type photosensitive resin composition which is excellent in chemical resistance and mechanical properties.

In an exemplary embodiment of the present specification, the binder resin is further polymerized with a compound of the following Chemical Formula A; or a compound of the following Chemical Formula A1.

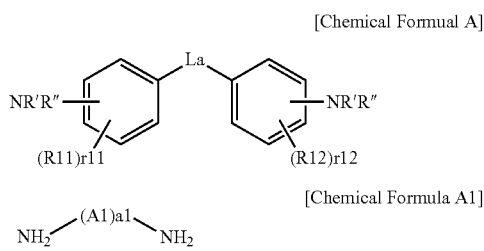

In Chemical Formulae A and A1,

La is a direct bond; a substituted or unsubstituted alkylene group; a substituted or unsubstituted arylene group; or —$SO_2$—, R11 and R12 are the same as or different from each other, and are each independently hydrogen; a hydroxyl group; or a substituted or unsubstituted alkyl group, r11 and r12 are the same as or different from each other, and are each independently an integer from 1 to 4, and when r11 is 2 or higher, R11's are the same as or different from each other, and when r12 is 2 or higher, R12's are the same as or different from each other, R' and R" are the same as or different from each other, and are each independently hydrogen; or —(C=O)Rn, Rn is a substituted or unsubstituted aryl group, A1 is —O—; —Si(R'''R'''')—; a substituted or unsubstituted alkylene group; a substituted or unsubstituted cycloalkylene group; or a substituted or unsubstituted arylene group, R''' and R'''' are the same as or different from each other, and are each independently a substituted or unsubstituted alkyl group, and a1 is an integer from 1 to 5, and when a1 is 2 or higher, A1's are the same as or different from each other.

In an exemplary embodiment of the present specification, La is a direct bond; a substituted or unsubstituted alkylene group having 1 to 30 carbon atoms; a substituted or unsubstituted arylene group having 6 to 30 carbon atoms; or —$SO_2$—.

In an exemplary embodiment of the present specification, La is a direct bond; a substituted or unsubstituted alkylene group having 1 to 20 carbon atoms; a substituted or unsubstituted arylene group having 6 to 20 carbon atoms; or —$SO_2$—.

In an exemplary embodiment of the present specification, La is a direct bond; a substituted or unsubstituted alkylene group having 1 to 10 carbon atoms; a substituted or unsubstituted arylene group having 6 to 13 carbon atoms; or —$SO_2$—.

In an exemplary embodiment of the present specification, La is a direct bond; a substituted or unsubstituted methylene group; a substituted or unsubstituted fluorenylene group; or —$SO_2$—.

In an exemplary embodiment of the present specification, La is a direct bond; a methylene group which is substituted with —$CF_3$; a fluorenylene group; or —$SO_2$—.

In an exemplary embodiment of the present specification, R11 and R12 are the same as or different from each other, and are each independently hydrogen; a hydroxyl group; or a substituted or unsubstituted alkyl group having 1 to 30 carbon atoms.

In an exemplary embodiment of the present specification, R11 and R12 are the same as or different from each other, and are each independently hydrogen; a hydroxyl group; or a substituted or unsubstituted alkyl group having 1 to 20 carbon atoms.

In an exemplary embodiment of the present specification, R11 and R12 are the same as or different from each other, and are each independently hydrogen; a hydroxyl group; or a substituted or unsubstituted alkyl group having 1 to 10 carbon atoms.

In an exemplary embodiment of the present specification, R11 and R12 are the same as or different from each other, and are each independently hydrogen; a hydroxyl group; or a substituted or unsubstituted methyl group.

In an exemplary embodiment of the present specification, R11 and R12 are the same as or different from each other, and are each independently hydrogen; a hydroxyl group; or —$CF_3$.

In an exemplary embodiment of the present specification, R' and R" are hydrogen. In an exemplary embodiment of the present specification, R' and R" are each independently —(C=O)Rn.

In an exemplary embodiment of the present specification, Rn is a substituted or unsubstituted aryl group having 6 to 30 carbon atoms.

In an exemplary embodiment of the present specification, Rn is a substituted or unsubstituted aryl group having 6 to 20 carbon atoms.

In an exemplary embodiment of the present specification, Rn is a substituted or unsubstituted aryl group having 6 to 12 carbon atoms.

In an exemplary embodiment of the present specification, Rn is a substituted or unsubstituted phenyl group.

In an exemplary embodiment of the present specification, Rn is a phenyl group which is substituted with —$NH_2$.

In an exemplary embodiment of the present specification, A1 is —O—; —Si(R'''R'''')—; a substituted or unsubstituted alkylene group having 1 to 30 carbon atoms; a substituted or unsubstituted cycloalkylene group having 3 to 30 carbon atoms; or a substituted or unsubstituted arylene group having 6 to 30 carbon atoms.

In an exemplary embodiment of the present specification, A1 is —O—; —Si(R'''R'''')—; a substituted or unsubstituted alkylene group having 1 to 20 carbon atoms; a substituted or unsubstituted cycloalkylene group having 3 to 20 carbon atoms; or a substituted or unsubstituted arylene group having 6 to 20 carbon atoms.

In an exemplary embodiment of the present specification, A1 is —O—; —Si(R'''R'''')—; a substituted or unsubstituted alkylene group having 1 to 10 carbon atoms; a substituted or unsubstituted cycloalkylene group having 3 to 10 carbon atoms; or a substituted or unsubstituted arylene group having 6 to 12 carbon atoms.

In an exemplary embodiment of the present specification, A1 is —O—; —Si(R'''R'''')—; a substituted or unsubstituted methylene group; a substituted or unsubstituted ethylene group; a substituted or unsubstituted cyclohexylene group; or a substituted or unsubstituted naphthylene group.

In an exemplary embodiment of the present specification, A1 is —O—; —Si(R'''R'''')—; a methylene group; an ethylene group; a cyclohexylene group which is substituted with a methyl group; or a naphthylene group.

In an exemplary embodiment of the present specification, R''' and R'''' are the same as or different from each other, and are each independently a substituted or unsubstituted alkyl group having 1 to 30 carbon atoms.

In an exemplary embodiment of the present specification, R''' and R'''' are the same as or different from each other, and are each independently a substituted or unsubstituted alkyl group having 1 to 20 carbon atoms.

In an exemplary embodiment of the present specification, R''' and R'''' are the same as or different from each other, and are each independently a substituted or unsubstituted alkyl group having 1 to 10 carbon atoms.

In an exemplary embodiment of the present specification, R''' and R'''' are the same as or different from each other, and are each independently a substituted or unsubstituted methyl group.

In an exemplary embodiment of the present specification, R''' and R'''' are a methyl group.

In an exemplary embodiment of the present specification, Chemical Formula A may be any one of the following compounds, but is not limited thereto.

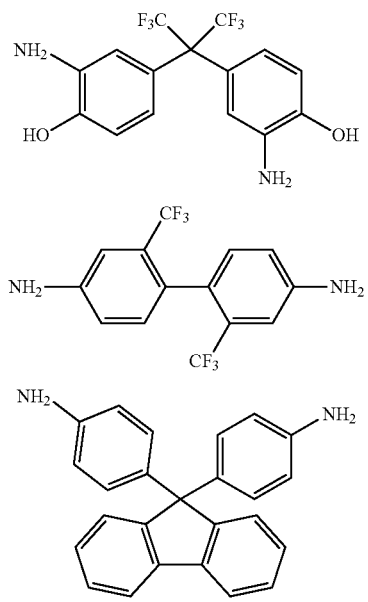

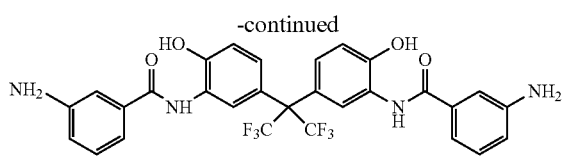

In an exemplary embodiment of the present specification, Chemical Formula A1 may be any one of the following compounds, but is not limited thereto.

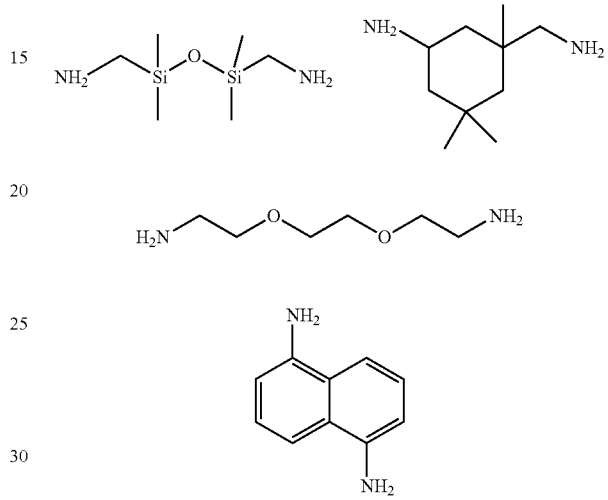

In the exemplary embodiment of the present specification, the structure in which the compound of Chemical Formula A is further polymerized with the binder resin may be represented by the following Chemical Formula A-1.

[Chemical Formula A-1]

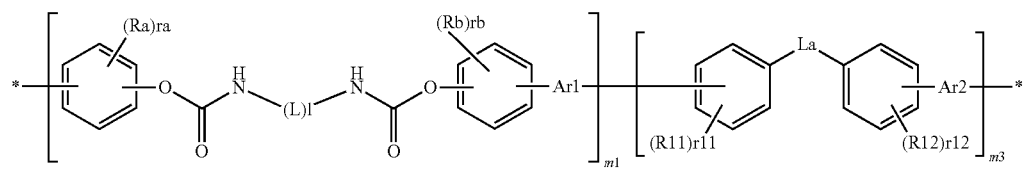

-continued

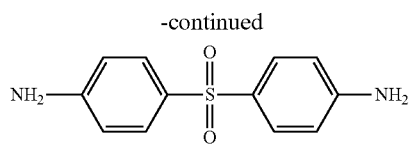

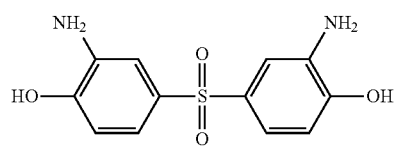

In Chemical Formula A-1, *——— means a moiety linked to another substituent or a repeating unit, L, l, Ra, Rb, ra and rb are the same as the definitions in Chemical Formula 1, La, R11, R12, r11 and r12 are the same as the definitions in Chemical Formula A, m2 is an integer from 1 to 130, m3 is an integer from 1 to 130, and when m2 and m3 are each 2 or higher, structures in the parenthesis are the same as or different from each other, Ar1 and Ar2 are the same as or different from each other, and are each independently any one of the following structures, and

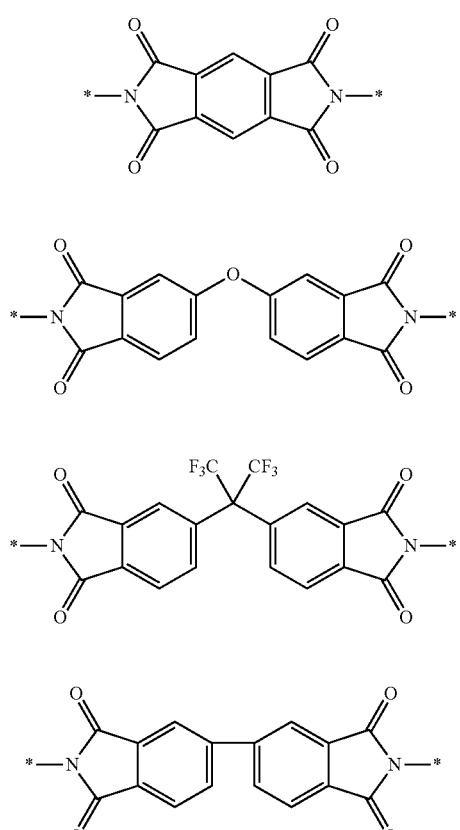
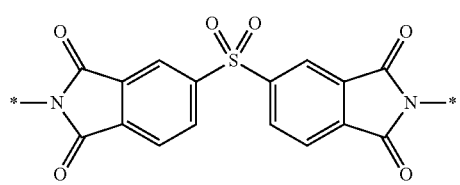
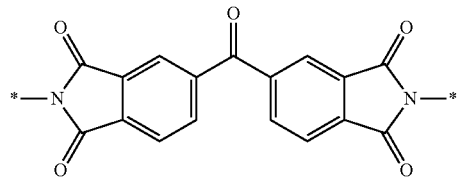
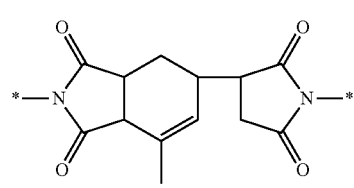
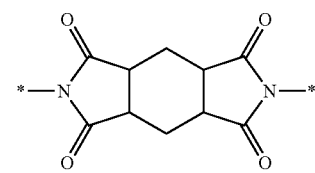
in the structure, *—— means a moiety linked to Chemical Formula A-1.
In an exemplary embodiment of the present specification, Chemical Formula A-1 may be any one of the following structures, but is not limited thereto.
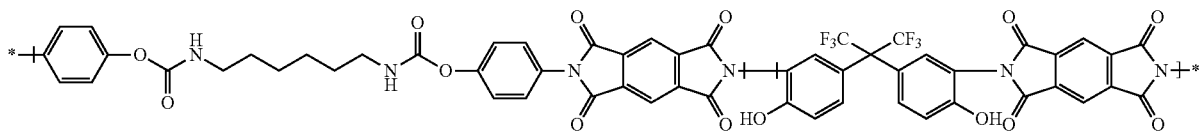
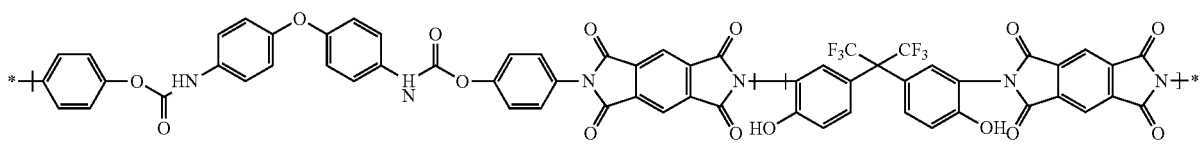
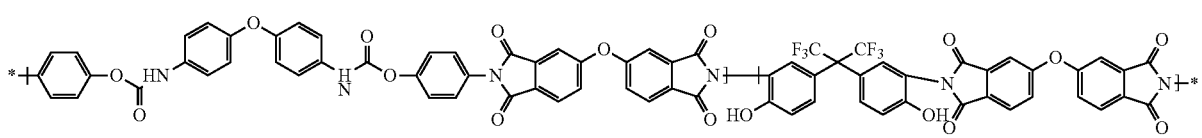

In the structure, *⎯ means a moiety linked to another substituent or a repeating unit.

In an exemplary embodiment of the present specification, Chemical Formula A-1 is represented by the following structure.

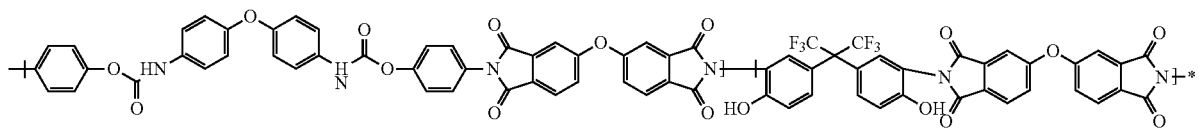 [SMILES: *N1C(=O)c2ccc(Oc3ccc4c(c3)C(=O)N(c3cc(C(c5ccc(O)c(N6C(=O)c7ccc(Oc8ccc9c(c8)C(=O)N(c8ccc(OC(=O)Nc%10ccc(Oc%11ccc(NC(=O)Oc%12ccc(C)cc%12)cc%11)cc%10)cc8)C9=O)cc7C6=O)c5)(C(F)(F)F)C(F)(F)F)ccc3O)C4=O)cc2C1=O]

In the structure, *⎯ means a moiety linked to another substituent or a repeating unit.

In an exemplary embodiment of the present specification, the compound of Chemical Formula A may be included in an amount of 50 parts by weight to 150 parts by weight based on 100 parts by weight of the dianhydride compound, and polymerized.

When the compound of Chemical Formula A satisfies the above-described range of parts by weight, it is possible to provide a binder resin capable of preparing a positive-type photosensitive resin composition which is excellent in chemical resistance and mechanical properties.

In an exemplary embodiment of the present specification, the binder resin is further polymerized with a compound of the following Chemical Formula B or a compound of the following Chemical Formula B1.

[Chemical Formula B]

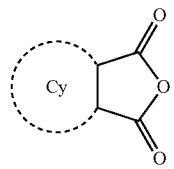

[Chemical Formula B1]

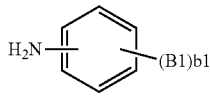

In Chemical Formulae B and B1,
Cy is a substituted or unsubstituted aromatic ring or a substituted or unsubstituted aliphatic ring,
B1 is hydrogen or a hydroxyl group, and
b1 is an integer from 1 to 5, and when b1 is 2 or higher, B1's are the same as or different from each other.

In an exemplary embodiment of the present specification, Cy is a substituted or unsubstituted benzene ring; or a substituted or unsubstituted bicycloheptene.

In an exemplary embodiment of the present specification, Cy is a benzene ring which is unsubstituted or substituted with —COOH; or a bicycloheptene.

In an exemplary embodiment of the present specification, Chemical Formula B may be any one of the following compounds, but is not limited thereto.

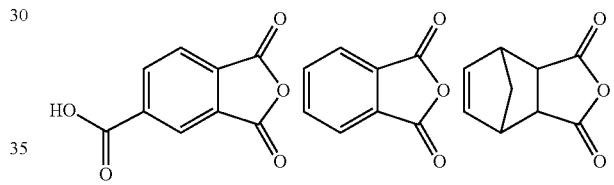

In an exemplary embodiment of the present specification, B1 is hydrogen.

In an exemplary embodiment of the present specification, B1 is a hydroxyl group.

In an exemplary embodiment of the present specification, Chemical Formula B1 may be the following compound, but is not limited thereto.

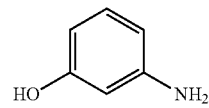

In an exemplary embodiment of the present specification, the structure in which the compound of Chemical Formula B is further polymerized with the binder resin may be represented by the following Chemical Formula B-1.

[Chemical Formula B-1]

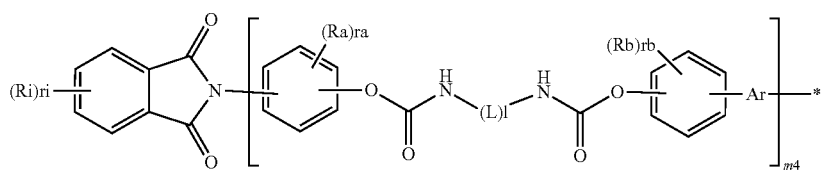

In Chemical Formula B-1, *—— means a moiety linked to another substituent or a repeating unit, L, l, Ra, Rb, ra and rb are the same as the definitions in Chemical Formula 1, Ri is hydrogen; or —COOH, ri is an integer from 1 to 4, and when ri is 2 or higher, Ri's are the same as or different from each other, m4 is an integer from 1 to 130, and when m4 is 2 or higher, structures in the parenthesis are the same as or different from each other, Ar is any one of the following structures, and

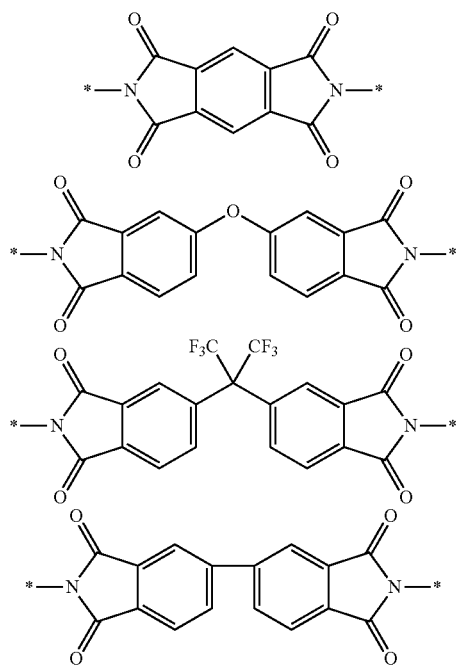

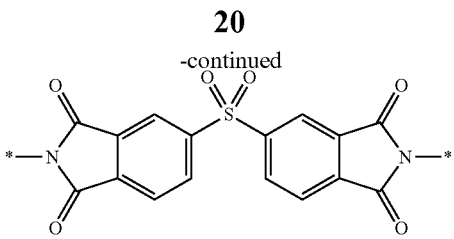

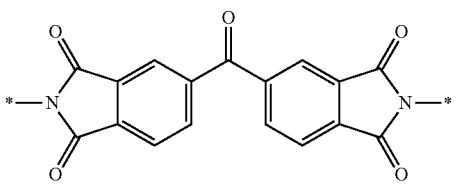

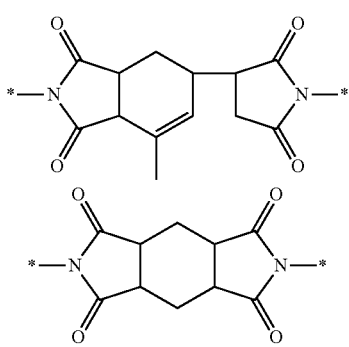

in the structure, *—— means a moiety linked to Chemical Formula B-1.

In an exemplary embodiment of the present specification, when the compound of Chemical Formula B is further polymerized with the binder resin, the resulting product may be represented as follows.

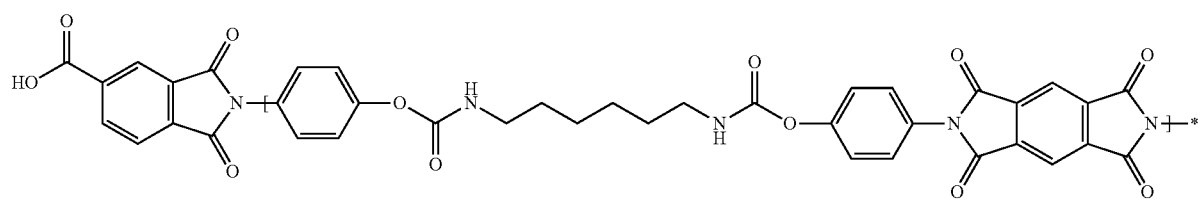

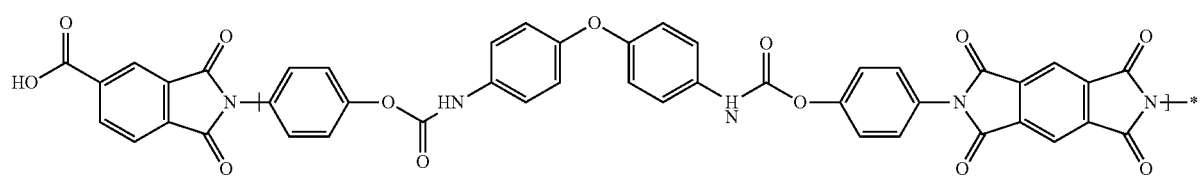

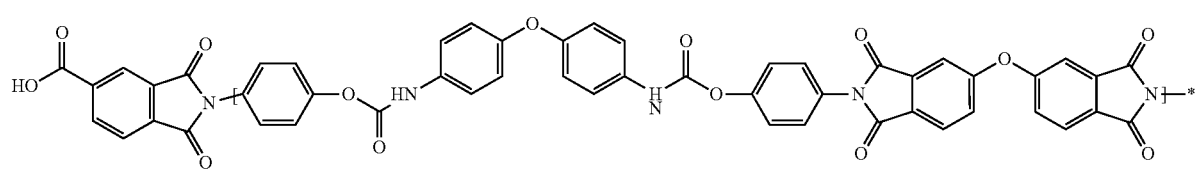

In the structure, *─── means a moiety linked to another substituent or a repeating unit.

In an exemplary embodiment of the present specification, when the compound of Chemical Formula B is further polymerized with the binder resin, the resulting product is represented by the following structure.

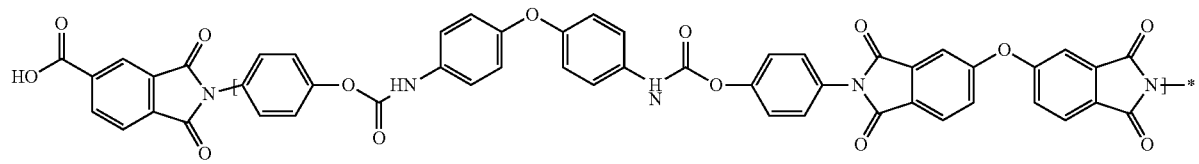 [SMILES: *N1C(=O)c2ccc(Oc3ccc4c(c3)C(=O)N(c3ccc(OC(=O)Nc5ccc(Oc6ccc(NC(=O)Oc7ccc(N8C(=O)c9ccc(C(=O)O)cc9C8=O)cc7)cc6)cc5)cc3)C4=O)cc2C1=O]

In the structure, *─── means a moiety linked to another substituent or a repeating unit.

In an exemplary embodiment of the present specification, the compound of Chemical Formula B may be included in an amount of 5 parts by weight to 50 parts by weight based on 100 parts by weight of the dianhydride compound, and polymerized.

When the compound of Chemical Formula B satisfies the above-described range of parts by weight, it is possible to provide a binder resin capable of preparing a positive-type photosensitive resin composition which is excellent in chemical resistance and mechanical properties.

In an exemplary embodiment of the present specification, the binder resin may include a structure in which the compound of Chemical Formula 1; a dianhydride compound; the compound of Chemical Formula A; and the compound of Chemical Formula B are polymerized. In this case, the binder resin includes 10 parts by weight to 90 parts by weight of the compound of Chemical Formula 1, 50 parts by weight to 150 parts by weight of the compound of Chemical Formula A, and 5 parts by weight to 50 parts by weight of the compound of Chemical Formula B based on 100 parts by weight of the dianhydride compound.

In an exemplary embodiment of the present specification, the structure in which the compound of Chemical Formula 1; a dianhydride compound; the compound of Chemical Formula A; and the compound of Chemical Formula B are polymerized may be represented by the following Chemical Formula M.

When the weight average molecular weight of the binder resin satisfies the above-described range, the binder resin has the effects of improving the sensitivity and increasing the mechanical properties.

The weight average molecular weight is one of the average molecular weights in which the molecular weight is not uniform and the molecular weight of any polymer material is used as a reference, and is a value obtained by averaging the molecular weight of a component molecular species of a polymer compound having a molecular weight distribution by a weight fraction.

The weight average molecular weight may be measured by gel permeation chromatography (GPC) analysis.

An exemplary embodiment of the present specification provides a positive-type photosensitive resin composition including: the binder resin; a photo active compound; a cross-linking agent; a surfactant; and a solvent.

In an exemplary embodiment of the present specification, the positive-type photosensitive resin composition includes: 10 parts by weight to 40 parts by weight of the photo active compound; 5 parts by weight to 50 parts by weight of the cross-linking agent; 0.05 part by weight to 5 parts by weight of the surfactant; and 50 parts by weight to 300 parts by weight of the solvent based on 100 parts by weight of the binder resin.

When each constituent element is included in the above-described range of parts by weight in the positive-type photosensitive resin composition, the positive-type photosensitive resin composition has the effects of forming a pattern and increasing mechanical properties.

If necessary, when the photosensitive resin composition is a positive-type photosensitive resin composition, an imidization catalyst which assists in the imidization reaction may be included, and an additive such as an adhesive aid may be further included.

[Chemical Formula M]

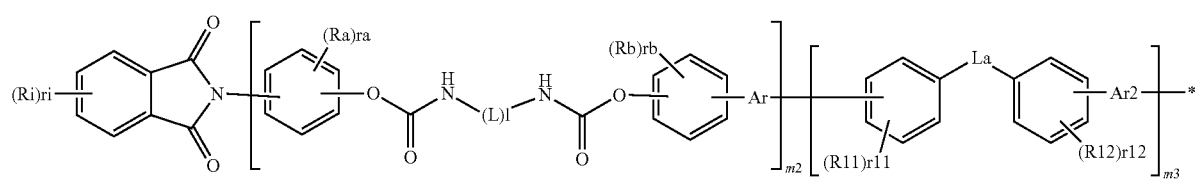

In Chemical Formula M, the definition of each substituent is the same as that previously defined.

In an exemplary embodiment of the present specification, the binder resin has a weight average molecular weight of 1,000 g/mol to 70,000 g/mol. Preferably, the weight average molecular weight thereof is 8,000 g/mol to 35,000 g/mol.

The additive may be included in an amount of 0.1 part by weight to 70 parts by weight based on 100 parts by weight of the binder resin.

The photo active compound may be specifically a quinonediazide compound. As the quinonediazide compound, for example, TPA529, THA515 or PAC430 manufactured by Miwon Commercial Co., Ltd. may be used, but the compound is not limited thereto.

The cross-linking agent is not particularly limited, and may be used without limitation as long as the cross-linking agent is applied to the art. As the cross-linking agent, it is possible to use, for example, 2-[[4-[2-[4-[1,1-bis[4-(oxiran-2-ylmethoxy)phenyl]ethyl]phenyl]propan-2-yl]phenoxy] methyl]oxirane, 4,4'-methylenebis(N,N-bis(oxiran-2-ylmethyl)aniline), and YD-127, YD-128, YD-129, YDF-170, YDF-175, and YDF-180 manufactured by Kukdo Chemical Co., Ltd, and the like.

The surfactant is a silicone-based surfactant or a fluorine-based surfactant, and specifically, as the silicone-based surfactant, it is possible to use BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341v344, BYK-345v346, BYK-348, BYK-354, BYK-355, BYK-356, BYK-358, BYK-361, BYK-370, BYK-371, BYK-375, BYK-380, BYK-390 and the like, which are manufactured by BYK-Chemie Co., Ltd., and as the fluorine-based surfactant, it is possible to use F-114, F-177, F-410, F-411, F-450, F-493, F-494, F-443, F-444, F-445, F-446, F-470, F-471, F-472SF, F-474, F-475, F-477, F-478, F-479, F-480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF1132, TF1027SF, TF-1441, TF-1442 and the like, which are manufactured by DaiNippon Ink & Chemicals, Inc. (DIC), but the surfactants are not limited thereto.

As the solvent, it is possible to employ a compound known to enable the formation of a photosensitive resin composition in the art to which the present invention pertains without particular limitation. As a non-limiting example, the solvent may be one or more compounds selected from the group consisting of esters, ethers, ketones, aromatic hydrocarbons, and sulfoxides.

The ester solvent may be ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, gamma-butyrolactone, epsilon-caprolactone, delta-valerolactone, alkyl oxyacetate (for example: methyl oxyacetate, ethyl oxyacetate, butyl oxyacetate (for example, methyl methoxyacetate, ethyl methoxyacetate, butyl methoxyacetate, methyl ethoxyacetate, ethyl ethoxyacetate, and the like)), 3-oxypropionic acid alkyl esters (for example: methyl 3-oxypropionate, ethyl 3-oxypropionate, and the like (for example, methyl 3-methoxypropionate, ethyl 3-methoxypropionate, methyl 3-ethoxypropionate, ethyl 3-ethoxypropionate, and the like)), 2-oxypropionic acid alkyl esters (for example: methyl 2-oxypropionate, ethyl 2-oxypropionate, propyl 2-oxypropionate, and the like (for example, methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionate and ethyl 2-oxy-2-methylpropionate (for example, methyl 2-methoxy-2-methylpropionate, ethyl 2-ethoxy-2-methylpropionate, and the like), methyl pyruvate, ethyl pyruvate, propyl pyruvate, methyl acetoacetate, ethyl acetoacetate, methyl 2-oxobutyrate, ethyl 2-oxobutyrate, or the like.

The ether solvent may be diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, propylene glycol monopropyl ether acetate, or the like.

The ketone solvent may be methyl ethyl ketone, cyclohexanone, cyclopentanone, 2-heptanone, 3-heptanone, N-methyl-2-pyrrolidone, or the like.

The aromatic hydrocarbon solvent may be toluene, xylene, anisole, limonene, or the like.

The sulfoxide solvent may be dimethyl sulfoxide or the like.

As the imidization catalyst, for example, an amine-based basic catalyst may be used. Specifically, the imidization catalyst may be a compound represented by any one of the following chemical formulae, but is not limited thereto.

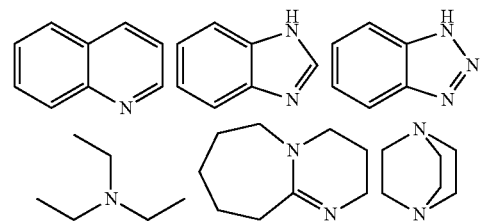

The adhesive aid is not particularly limited, and may be used without limitation as long as the adhesive aid is applied to the art. It is possible to use an alkoxy silane compound including at least one of an isocyanate group, an amino group, a urea group, an alkyl group, an epoxy group, an acrylate group, a vinyl group or a mercapto group, and the like.

An exemplary embodiment of the present specification provides an insulating film including the positive-type photosensitive resin composition or a cured product thereof.

The insulating film may include the positive-type photosensitive resin composition as it is.

The insulating film may include a cured product of the positive-type photosensitive resin composition.

Examples of a light source for curing the photosensitive resin composition according to the present specification include mercury vapor arc, carbon arc, Xe arc, and the like, which emit a light with a wavelength of 250 nm to 450 nm, but are not always limited thereto.

The insulating film may be further subjected to a step of heat-treating the positive-type photosensitive resin composition after curing the positive-type photosensitive resin composition, if necessary.

The heat treatment may be performed by a heating means such as a hot plate, a hot air circulation furnace, and an infrared furnace, and may be performed at a temperature of 180° C. to 250° C., or 190° C. to 220° C.

The insulating film exhibits excellent chemical resistance and mechanical properties, and thus may be preferably applied to an insulating film of a semiconductor device, an interlayer insulating film for a redistribution layer, and the like. Further, the insulation film may be applied to photoresists, etching resists, solder top resists, and the like.

The insulating film may include a support or substrate.

The support or substrate is not particularly limited, and those known in the art may be used. For example, a substrate for an electronic component or a predetermined wiring pattern formed on the substrate may be exemplified. Examples of the substrate include a metal substrate such as silicon, silicon nitride, titanium, tantalum, palladium, titanium tungsten, copper, chromium, iron, aluminum, gold, and nickel, a glass substrate, and the like. As a material of the wiring pattern, for example, copper, solder, chromium, aluminum, nickel, gold and the like may be used, but the material is not limited thereto. Preferably, the support or substrate may be a silicon wafer.

The application method is not particularly limited, but a spray method, a roll coating method, a spin coating method, and the like may be used, and in general, the spin coating method is widely used. Further, an application film is formed, and then in some cases, the residual solvent may be partially removed under reduced pressure.

In the present specification, the insulating film may have a thickness of 1 µm to 100 µm. When the thickness range of the insulating film is satisfied, it is possible to obtain an insulating film which is excellent in chemical resistance and mechanical properties, which are desired in the present specification. The thickness of the insulating film may be measured using a scanning electron microscope (SEM).

An exemplary embodiment of the present specification provides a semiconductor device including the insulating film.

The semiconductor device may be manufactured by further including various parts typically used in the art in addition to the insulating film.

Hereinafter, the present specification will be described in detail with reference to Examples for specifically describing the present specification. However, the Examples according to the present specification may be modified in various forms, and it is not interpreted that the scope of the present specification is limited to the Examples described below. The Examples of the present specification are provided to more completely explain the present specification to a person with ordinary skill in the art.

Preparation Examples

Preparation of Binder Resin A1

After 2,2-bis(3-amino-4-hydroxyphenyl)hexafluoropropane (bis-APAF)(20.5 g), bis(4-aminophenyl) hexane-1,6-diyldicarbamate (12.16 g), and 100 g of propylene glycol methyl ether acetate (PGMEA) were sequentially introduced into a 200-mL round bottom flask and completely dissolved by increasing the temperature to 120° C. and stirring the flask, the flask was cooled to 80° C., 4,4-oxydiphthalic anhydride (ODPA)(21.1 g) and trimellitic anhydride (TMA) (7.4 g) were introduced thereto, and then the resulting mixture was stirred along with toluene (20 g) at 150° C. After the components were completely dissolved, the resulting solution was cooled to 50° C., and then gamma valerolactone (γ-VL)(1.7 g) and triethylamine (TEA)(4.25 g) were diluted with 3 ml of propylene glycol methyl ether acetate (PGMEA), and the resulting diluted solution was introduced thereinto. The mixed solution was stirred at 175° C. for 16 hours, and then refluxed for 3 hours after a Dean-Stark distillation apparatus was installed such that water could be removed through the distillation apparatus. The solution was cooled to room temperature, and then recovered. The weight average molecular weight (Mw) of the recovered polymer was confirmed using gel permeation chromatography (GPC), and was determined to be 32,000 g/mol.

Preparation of Binder Resin A2

After 2,2-bis(3-amino-4-hydroxyphenyl)hexafluoropropane (bis-APAF)(20.5 g), bis(4-aminophenyl)(oxybis(4,1-phenylene))dicarbamate (14.8 g), and 100 g of propylene glycol methyl ether acetate (PGMEA) were sequentially introduced into a 200-mL round bottom flask and completely dissolved by increasing the temperature to 120° C. and stirring the flask, the flask was cooled to 80° C., 4,4-oxydiphthalic anhydride (ODPA)(21.1 g)(18.0 g) and trimellitic anhydride (TMA)(7.4 g) were introduced thereto, and then the resulting mixture was stirred along with toluene (20 g) at 150° C. After the components were completely dissolved, the resulting solution was cooled to 50° C., and then gamma valerolactone (γ-VL)(1.7 g) and triethylamine (TEA)(4.25 g) were diluted with 3 ml of propylene glycol methyl ether acetate (PGMEA), and the resulting diluted solution was introduced thereinto. The mixed solution was stirred at 175° C. for 16 hours, and then refluxed for 3 hours after a Dean-Stark distillation apparatus was installed such that water could be removed through the distillation apparatus. The solution was cooled to room temperature, and then recovered. The weight average molecular weight (Mw) of the recovered polymer was confirmed using gel permeation chromatography (GPC), and was determined to be 26,000 g/mol.

Preparation of Binder Resin B1

After 2,2-bis(3-amino-4-hydroxyphenyl)hexafluoropropane (bis-APAF)(20.5 g), hexane-1,6-diamine (3.65 g), and 100 g of propylene glycol methyl ether acetate (PGMEA) were sequentially introduced into a 200-mL round bottom flask and completely dissolved by increasing the temperature to 120° C. and stirring the flask, the flask was cooled to 80° C., pyromellitic dianhydride (PMDA)(18.0 g) and trimellitic anhydride (TMA)(7.4 g) were introduced thereto, and then the resulting mixture was stirred along with toluene (20 g) at 150° C. After the components were completely dissolved, the resulting solution was cooled to 50° C., and then gamma valerolactone (γ-VL)(1.7 g) and triethylamine (TEA)(4.25 g) were diluted with 3 ml of PGMEA, and the resulting diluted solution was introduced thereinto. The mixed solution was stirred at 175° C. for 16 hours, and then refluxed for 3 hours after a Dean-Stark distillation distillation apparatus was installed such that water could be removed through the distillation apparatus. The solution was cooled to room temperature, and then recovered. The weight average molecular weight (Mw) of the recovered polymer was confirmed using gel permeation chromatography (GPC), and was determined to be 31,000 g/mol.

Preparation of Binder Resin B2

After 2,2-bis(3-amino-4-hydroxyphenyl)hexafluoropropane (bis-APAF)(20.5 g), 4,4'-oxydianiline (6.30 g), and 100 g of propylene glycol methyl ether acetate (PGMEA) were sequentially introduced into a 200-mL round bottom flask and completely dissolved by increasing the temperature to 120° C. and stirring the flask, the flask was cooled to 80° C., 4,4-oxydiphthalic anhydride (ODPA)(21.1 g) and trimellitic anhydride (TMA)(7.4 g) were introduced thereto, and then the resulting mixture was stirred along with toluene (20 g) at 150° C. After the components were completely dissolved, the resulting solution was cooled to 50° C., and then gamma valerolactone (γ-VL)(1.7 g) and triethylamine (TEA)(4.25 g) were diluted with 3 ml of PGMEA, and the resulting diluted solution was introduced thereinto. The mixed solution was stirred at 175° C. for 16 hours, and then refluxed for 3 hours after a Dean-Stark distillation distillation apparatus was installed such that water could be removed through the distillation apparatus. The solution was cooled to room temperature, and then recovered. The weight average molecular weight (Mw) of the recovered polymer was confirmed using gel permeation chromatography (GPC), and was determined to be 28,000 g/mol.

Preparation of Binder Resin B3

After 2,2-bis(3-amino-4-hydroxyphenyl)hexafluoropropane (bis-APAF)(20.5 g), 4,4'-(hexane-1,6-diylbis(oxy))dianiline (9.46 g), and 100 g of propylene glycol methyl ether acetate (PGMEA) were sequentially introduced into a 200-mL round bottom flask and completely dissolved by increasing the temperature to 120° C. and stirring the flask, the flask was cooled to 80° C., pyromellitic dianhydride (PMDA) (18.0 g) and trimellitic anhydride (TMA)(7.4 g) were introduced thereto, and then the resulting mixture was stirred along with toluene (20 g) at 150° C. After the components were completely dissolved, the resulting solution was cooled to 50° C., and then gamma valerolactone (γ-VL)(1.7 g) and TEA (4.25 g) were diluted with 3 ml of PGMEA, and the resulting diluted solution was introduced thereinto. The mixed solution was stirred at 175° C. for 16 hours, and then refluxed for 3 hours after a Dean-Stark distillation distillation apparatus was installed such that water could be removed through the distillation apparatus. The solution was cooled to room temperature, and then recovered. The weight average molecular weight (Mw) of the recovered polymer was confirmed using gel permeation chromatography (GPC), and was determined to be 30,000 g/mol.

Preparation of Binder Resin B4

After 2,2-bis(3-amino-4-hydroxyphenyl)hexafluoropropane (bis-APAF)(20.5 g), bis(4-aminophenyl) hexane-1,6-diyldicarbamate (12.16 g), and 100 g of propylene glycol methyl ether acetate (PGMEA) were sequentially introduced into a 200-mL round bottom flask and completely dissolved by increasing the temperature to 120° C. and stirring the flask, the flask was cooled to 80° C., cyclobutane tetracarboxylic dianhydride (CBDA)(24.1 g) and trimellitic anhydride (TMA)(8.4 g) were introduced thereto, and then the resulting mixture was stirred along with toluene (20 g) at 150° C. After the components were completely dissolved, the resulting solution was cooled to 50° C., and then gamma valerolactone (γ-VL)(1.7 g) and triethylamine (TEA)(4.25 g) were diluted with 3 ml of propylene glycol methyl ether acetate (PGMEA), and the resulting diluted solution was introduced thereinto. The mixed solution was stirred at 175° C. for 16 hours, and then refluxed for 3 hours after a Dean-Stark distillation distillation apparatus was installed such that water could be removed through the distillation apparatus. The solution was cooled to room temperature, and then recovered. The weight average molecular weight (Mw) of the recovered polymer was confirmed using gel permeation chromatography (GPC), and was determined to be 29,000 g/mol.

Examples and Comparative Examples

Binder resin Preparation Examples A1, A2 and B1 to B4 were prepared by applying the components and contents shown in the following Table 1 based on 100 parts by weight of the dianhydride compound, and the weight average molecular weight (Mw) of each binder resin is shown in the following Table 1.

TABLE 1

| Polymerization Example | Diamine | | | | Dianhydride | | End capper | | Mw (g/mol) |
| --- | --- | --- | --- | --- | --- | --- | --- | --- | --- |
| | Component | Parts by weight | Component | Parts by weight | Component | Parts by weight | Component | Parts by weight | |
| A1 | Bis-APAF | 100 | a1 | 60 | ODPA | 100 | TMA | 35 | 32,000 |
| A2 | Bis-APAF | 110 | a1 | 70 | ODPA | 100 | TMA | 40 | 26,000 |
| B1 | Bis-APAF | 110 | b1 | 20 | PMDA | 100 | TMA | 40 | 31,000 |
| B2 | Bis-APAF | 100 | b2 | 30 | ODPA | 100 | TMA | 35 | 28,000 |
| B3 | Bis-APAF | 110 | b3 | 50 | PMDA | 100 | TMA | 40 | 30,000 |
| B4 | Bis-APAF | 100 | a1 | 60 | CBDA | 100 | TMA | 40 | 29,000 |

Bis-APAF: 2,2-bis 3-amino-4-hydroxyphenyl)hexafluoropropane
a1: bis(4-aminophenyl) hexane-1,6-diyldicarbamate
a2: bis(4-aminophenyl) (oxybis(4,1-phenylene))dicarbamate
b1: hexane-1,6-diamine
b2: 4,4'-oxydianiline
b3: 4,4'-(hexane-1,6-diylbis(oxy))dianiline
ODPA: 4,4-oxydiphthalic dianhydride
CBDA: cyclobutane tetracarboxylic dianhydride
PMDA: pyromellitic dianhydride
TMA: trimellitic anhydride A positive-type photosensitive resin composition was prepared from the components described in the following Table 2.

Specifically, the positive-type photosensitive resin composition was prepared by including the parts by weight of each component described in the following Table 2 and 200 parts by weight of a solvent based on 100 parts by weight of the prepared binder resin.

The prepared positive-type photosensitive resin composition was cured under the following conditions, and then evaluated, and the results are shown in the following Table 2.

After spin coating, a soft bake was performed, and then exposure was performed using an exposure device, development was performed using a developing solution (2.38 wt % TMAH sol.), and then a post bake was performed.

Resist evaluation conditions: PrB 120° C./120 s, PB 180° C./2 hr, thickness 5 μm, exposure: 300 to 900 mJ/cm² i-line stepper, development: 23° C., 2.38 wt % tetramethylammonium hydroxide (TMAH) solution, Dipping, DI water rinse

[Chemical Resistance] (Measurement of thickness by Alpha-step after being soaked in amine stripper for 15 minutes)

After the prepared insulating film having a thickness of 5 μm was soaked in an amine-based stripper for 15 minutes, the thickness was measured by Alpha-step and evaluated under the following conditions.

Maintenance of thickness (○): No change in thickness
Change in thickness (Δ): Increase or decrease in thickness

[Elongation] (Measurement of UTM after Manufacture of Film)

An elongation of the prepared insulating film having a thickness of 5 μm was measured by a universal testing machine (UTM) under the conditions of room temperature and a velocity of 5 cm/min, and evaluated under the following conditions.

⊚: 40% or more
○: 20% or more and less than 40%
Δ: 0 or more and less than 20%

TABLE 2

| Content (parts by weight) | Binder resin | | Photo active compound | | Cross-linking agent | | Surfactant | | Chemical resistance | Elongation |
| --- | --- | --- | --- | --- | --- | --- | --- | --- | --- | --- |
| | Preparation Example | Parts by weight | Component | Parts by weight | Component | Parts by weight | Component | Parts by weight | | |
| Example 1 | A1 | 100 | C | 15 | D | 20 | E | 0.1 | ○ | ⊚ |
| Example 2 | A2 | 100 | C | 15 | D | 20 | E | 0.1 | ○ | ⊚ |
| Comparative Example 1 | B1 | 100 | C | 15 | D | 20 | E | 0.1 | Δ | Δ |
| Comparative Example 2 | B2 | 100 | C | 15 | D | 20 | E | 0.1 | ○ | Δ |
| Comparative Example 3 | B3 | 100 | C | 15 | D | 20 | E | 0.1 | Δ | ○ |
| Comparative Example 4 | B4 | 100 | C | 15 | D | 20 | E | 0.1 | Δ | ○ |

C: TPA529 (Miwon Commercial Co., Ltd.)
D: 2-[[4-[2-[4-[1,1-bis[4-(oxiran-2-ylmethoxy)phenyl]ethyl]phenyl]propan-2-yl]phenoxy]methyl]oxirane
E: BYK-307 (BYK-Chemie Co., Ltd.)

According to Table 2, it can be confirmed that Examples 1 and 2 are excellent in chemical resistance due to no change in thickness of the insulting films before and after the preparation of the insulting films, and are excellent in mechanical properties due to their high elongations compared to Comparative Examples 1 to 4.

From the confirmation, it was confirmed that the binder resin according to the present specification could provide a positive-type photosensitive resin composition and an insulating film, which are excellent in chemical resistance and mechanical properties due to a 3D structure thereof by including a urethane functional group.

The invention claimed is:

1. A binder resin comprising a structure in which a compound of the following Chemical Formula 1 and a dianhydride compound are polymerized:

[Chemical Formula 1]

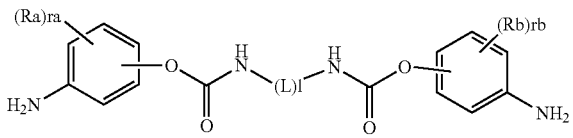

in Chemical Formula 1,

L is —O—; a substituted or unsubstituted alkylene group; or a substituted or unsubstituted arylene group, l is an integer from 1 to 10, when l is 2 or higher, L's are the same as or different from each other, Ra and Rb are the same as or different from each other, and are each independently hydrogen; or a substituted or unsubstituted alkyl group, ra and rb are the same as or different from each other, and are each independently an integer from 0 to 4, and when ra is 2 or higher, Ra's are the same as or different from each other, and when rb is 2 or higher, Rb's are the same as or different from each other, and wherein the dianhydride compound is an oxydiphthalic anhydride (ODPA).

2. The binder resin of claim 1, wherein L is a substituted or unsubstituted alkylene group.

3. The binder resin of claim 1, wherein (L)l is represented by the following Chemical Formula 2:

[Chemical Formula 2]

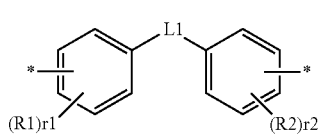

in Chemical Formula 2,

∗— means a moiety linked to Chemical Formula 1,

L1 is —O—; a substituted or unsubstituted alkylene group; or a substituted or unsubstituted arylene group, R1 and R2 are the same as or different from each other, and are each independently hydrogen; or a substituted or unsubstituted alkyl group, and r1 and r2 are the same as or different from each other, and are each independently an integer from 0 to 4, and when r1 and r2 are each 2 or higher, R1 and R2 are each the same as or different from each other.

4. The binder resin of claim 1, wherein a compound of the following Chemical Formula A; or a compound of the following Chemical Formula A1 is further polymerized:

[Chemical Formula A]

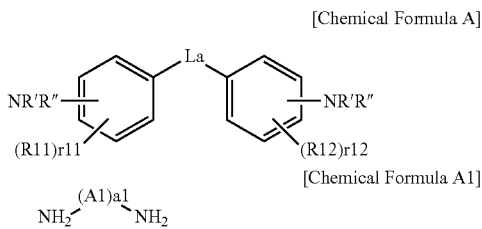

[Chemical Formula A1]

(A1)a1
NH₂    NH₂ in Chemical Formulae A and A1,

La is a direct bond; a substituted or unsubstituted alkylene group; a substituted or unsubstituted arylene group; or —SO₂—, R11 and R12 are the same as or different from each other, and are each independently hydrogen; a hydroxyl group; or a substituted or unsubstituted alkyl group, r11 and r12 are the same as or different from each other, and are each independently an integer from 1 to 4, and when r11 is 2 or higher, R11's are the same as or different from each other, and when r12 is 2 or higher, R12's are the same as or different from each other, R' and R" are the same as or different from each other, and are each independently hydrogen; or —(C=O)Rn, Rn is a substituted or unsubstituted aryl group, A1 is —O—; —Si(R'''R'''')—; a substituted or unsubstituted alkylene group; a substituted or unsubstituted cycloalkylene group; or a substituted or unsubstituted arylene group, R''' and R'''' are the same as or different from each other, and are each independently a substituted or unsubstituted alkyl group, and a1 is an integer from 1 to 5, and when a1 is 2 or higher, A1's are the same as or different from each other.

5. The binder resin of claim 1, wherein a compound of the following Chemical Formula B or a compound of the following Chemical Formula B1 is further polymerized:

[Chemical Formula B]

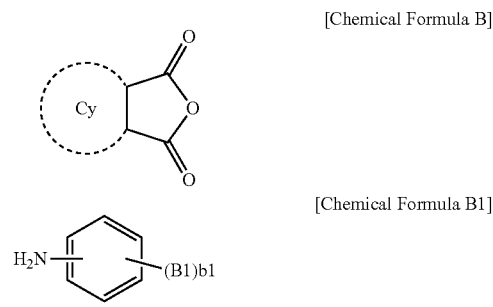

[Chemical Formula B1]

in Chemical Formulae B and B1,

Cy is a substituted or unsubstituted aromatic ring or a substituted or unsubstituted aliphatic ring, B1 is hydrogen or a hydroxyl group, and b1 is an integer from 1 to 5, and when b1 is 2 or higher, B1's are the same as or different from each other.

6. The binder resin of claim 1, wherein the binder resin has a weight average molecular weight of 1,000 g/mol to 70,000 g/mol.

7. A positive-type photosensitive resin composition comprising: the binder resin of claim 1; a photo active compound; a cross-linking agent; a surfactant; and a solvent.

8. The positive-type photosensitive resin composition of claim 7, wherein based on 100 parts by weight of the binder resin, the positive-type photosensitive resin composition comprises:

10 parts by weight to 40 parts by weight of the photo active compound;

5 parts by weight to 50 parts by weight of the cross-linking agent;

0.05 part by weight to 5 parts by weight of the surfactant; and 50 parts by weight to 300 parts by weight of the solvent.

9. An insulating film comprising the positive-type photosensitive resin composition of claim 7 or a cured product thereof.

10. A semiconductor device comprising the insulating film of claim 9.

* * * * *